United States Patent [19]

Anger

[11] 4,090,077
[45] May 16, 1978

[54] PARTICLE BEAM DEVICE WITH A DEFLECTION SYSTEM AND A STIGMATOR

[75] Inventor: Klaus Anger, Berlin, Germany

[73] Assignee: Siemens Aktiengesellschaft, Berlin & Munich, Germany

[21] Appl. No.: 646,669

[22] Filed: Jan. 5, 1976

Related U.S. Application Data

[63] Continuation of Ser. No. 516,600, Oct. 21, 1974, abandoned, which is a continuation of Ser. No. 382,545, Jul. 25, 1973, abandoned, which is a continuation of Ser. No. 198,586, Nov. 15, 1971, abandoned, which is a continuation of Ser. No. 15,461, Mar. 2, 1970, abandoned.

[30] Foreign Application Priority Data

Mar. 5, 1969 Germany .............................. 1912235

[51] Int. Cl.² ............................................ H01J 37/26
[52] U.S. Cl. .................................. 250/311; 250/396 R
[58] Field of Search ............... 250/306, 307, 309, 310, 250/311, 396, 397, 398, 399, 400; 219/121 EB

[56] References Cited

U.S. PATENT DOCUMENTS

| | | | |
|---|---|---|---|
| 3,150,258 | 9/1964 | Wilska | 250/39 C |
| 3,371,206 | 2/1968 | Takizawa | 250/39 C |
| 3,453,485 | 7/1969 | Herrmann | 250/39 C |
| 3,644,733 | 2/1972 | Wolff | 250/39 C |

*Primary Examiner*—Craig E. Church
*Attorney, Agent, or Firm*—Herbert L. Lerner

[57] ABSTRACT

A particle beam device is provided with an arrangement for eliminating deflection errors having a deflection system and a stigmator. The deflection system has at least two pairs of deflection means disposed in a single plane at right angles to each other. The two deflection means of each of the pairs are disposed diametrically opposite each other and are centered with respect to the beam axis. The stigmator has at least four pairs of field generating means grouped into two systems of two pairs each and the two field generating means of each of the pairs are likewise disposed diametrically opposite each other and centered with respect to the beam axis. The two systems are disposed in the single plane at right angles to each other and are arranged so that each of the systems forms an angle of 45° with the two pairs of deflection means.

1 Claim, 5 Drawing Figures

PARTICLE BEAM DEVICE WITH A DEFLECTION SYSTEM AND A STIGMATOR

This is a continuation application of Ser. No. 516,600, filed 10/21/74, which is a continuation application of Ser. No. 382,545, filed 7/25/73, which, in turn, is a continuation application of Ser. No. 198,586, filed 11/15/71, which, in turn, is a continuation of Ser. No. 15,461, filed 3/2/70, all abandoned.

DESCRIPTION OF THE INVENTION:

My invention relates to a particle beam device equipped with an arrangement for eliminating deflection faults or errors. The particle beam device of the invention comprises pairs of deflection means disposed diametrically opposite each other relative to the particle beam, and a stigmator having pairs of field generating means likewise disposed relative to the beam to compensate for deflection astigmatism.

It is known, from U.S. Pat. No. 3,371,206, for example, that distortion error from deflection systems can be removed by providing a compensator ahead of the deflection system in beam direction. The compensator compensates for deformations of the beam cross-section by generating a suitable correction field. The compensator is a component that is independent of the deflection system and disposed before the deflection system in beam direction and, accordingly, increases the height of the device. With modern development, not only because of space considerations, but also because of particle beam optical considerations, it is important to be as free as possible of construction-conditioned requirements with respect to the determination of the dimensions between the beam generator and/or the condenser lens on the one hand and the specimen on the other hand.

Accordingly, it is an object of my invention to provide a particle beam device of the aforedescribed type, preferably an electron or ion microscope, which takes into account the aforementioned construction requirements. Subsidiary to this object, it is an object of my invention to provide a particle beam device equipped with a deflection system having two pairs of deflection means disposed in a common plane at right angles to each other and a stigmator having two systems, each comprising two pairs of field generating means also arranged in the aforementioned plane at right angles to each other and displaced from the pairs of deflection means by 45°.

According to a feature of the invention, the components of the deflection system, as well as the components of the stigmator, are disposed in a common plane, so that additional space is saved and, if required, the deflection means and the field generating means of the stigmator are joinable in a single building block member insertable into the particle beam device. It is advantageous to cast the deflection means and the field generating means of the stigmator, all of which are arranged in a common plane, in a unitary building block member.

Since the pairs of field generating means of the stigmator form a 45° angle with the pairs of deflection means, the former can be disposed in the spaces formed between adjacent deflection means. A coil carrier for the deflection means may be so formed that it serves simultaneously as a coil carrier for the field-generating means of the stigmator, said stigmator also comprising coils.

With the aforedescribed construction of the stigmator, a configuration is realized wherein the stigmator coils loop the mutually adjacent regions formed by respective neighboring deflection means. The deflection means may comprise known electrostatic plates or coils. It is noted that it is within the scope of the invention that electrostatic deflection plates can be used for the field generating means of the stigmator. It is also possible that the deflection system on the one hand, and the field generating means of the stigmator on the other hand, may comprise different members, that is, part coils and part plates.

With the use of coils for the field generating means of the stigmator, it has been found to be especially expedient to supply these coils with an excitation current which is linearly or quadratically proportional to the excitation current of the deflection coils. Therefore, it is also an object of my invention to provide an arrangement for removing deflection faults wherein the stigmator excitation is proportional to the excitation of the deflection system.

Also, for the correction of the distortion, it is desirable to derive from the excitation of the deflection means an excitation having a magnitude proportional to the second or third power thereof, and further, to adjust the excitation of the deflection means which are arranged in respective stages and serve to deflect the beam in a common plane, the adjustment being in correspondence with this power of the actual or present value of the excitation. Accordingly, it is still another object of my invention to provide an arrangement for compensating for distortion wherein the excitation of the deflection system is adjusted in accordance with a value proportional to a power of its actual or instant value.

With a deflection system having a plurality of stages, the stigmator elements can be arranged in the plane corresponding to each stage. It is especially desirable to place the field-generating means of the stigmator only in the first stage in the beam direction. This is of special significance because the beam passes paraxially through this stage.

In order that the invention may be readily carried into effect, it will now be described with reference to the accompanying drawings, wherein.

Figure 1:
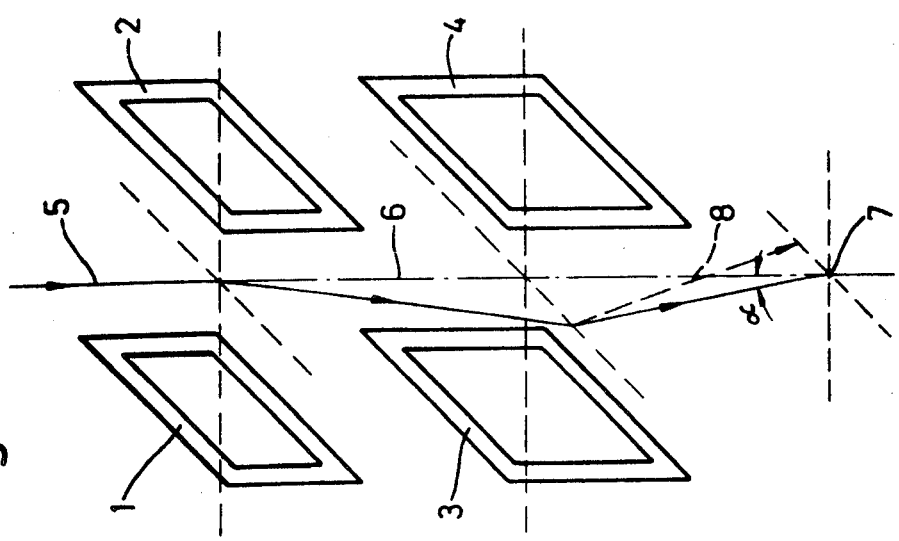
FIG. 1 is a schematic diagram illustrating deflection fault in a particle beam device.

It is known that deflection systems of the type of the invention cause deflection faults manifested by astigmatism or spot distortion and by a distortion or migration of the beam. Consider, for example, the arrangement schematically illustrated in FIG. 1, which is provided with a two stage deflection system having a pair of deflection coils 1, 2 and 3, 4, disposed in two respective planes and arranged so as to deflect the particle beam 5 in a plane containing the axis 6 of the apparatus. Accordingly, the distortion takes effect so that the beam does not meet the axis 6 in the region of the plane of the specimen, i.e. the beam does not impinge upon the desired point 7. Instead, there is a beam migration or shift dependent upon the deflection angle α and depicted by the broken line 8. In addition, there is an error caused by the deflection system, insofar that the circular section of beam 5 located ahead of the deflection system in beam direction is distorted when it impinges upon the specimen, i.e. an astigmatism occurs.

Figure 2:
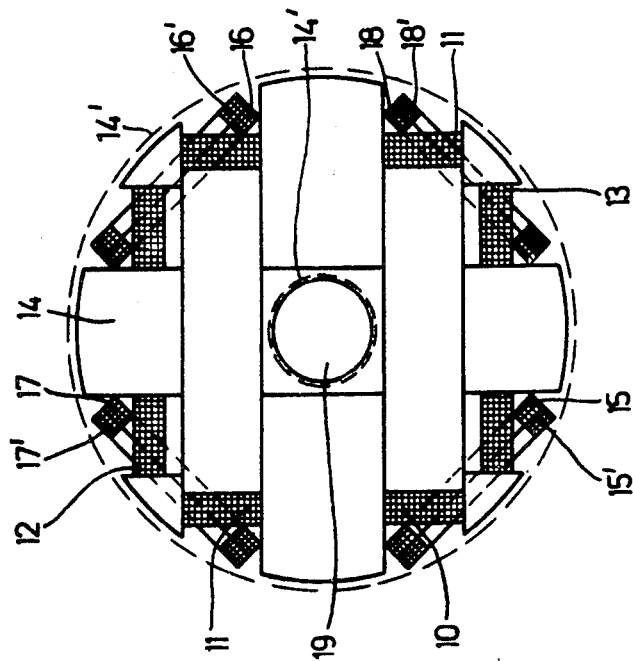
FIG. 2 is a view, partially in section, and seen in beam direction, of an illustrative embodiment of a deflection system of the invention with a stigmator.

In the embodiment of FIG. 2, the deflection system consists of two pairs of deflection coils 10, 11 and 12, 13 which are wound on a coil body 14. The coil body 14 is prefabricated from plastic which is later castable, or from a good heat-conducting metal such as aluminium.

The two coil pairs 10, 11 and 12, 13 act to deflect the beam in two directions perpendicular to each other. A stigmator is provided to compensate for the astigmatism which results therefrom and comprises two systems each having two pairs of coils 15, 16 and 17, 18 as well as 15', 16' and 17', 18' disposed opposite each other. In each instance, it is required that two pairs of stigmator elements having coincident axes be provided so that a compensation of an astigmatism having any direction is possible. Thus, with respect to the beam opening 19 in the coil body 14, there is a rotational-symmetrical arrangement of the coils.

As illustrated in FIG. 2, the stigmator coils 15 to 18 and 15' to 18' are arranged on the coil body, so that each of the coils loops the adjacent zones of every two neighboring deflection coils. In this embodiment, it is desirable to preform the stigmator coils before they are placed on the coil body 14. In joining thereafter, the entire assembly can be cast into a somewhat cylindrical unitary component indicated by the broken lines 14' and inserted into the particle beam device.

FIG. 2 shows that the invention affords the advantage that the available space is efficaciously used, since as far as practicable, only the spaces between the individual deflection coils and the projections on the coil body 14 provided for accommodating the stigmator coils are used. Understandably, the foregoing is made possible by providing a suitable electrical insulation, the latter rendering the deflection coils replaceable with electrostatic deflection plates.

Figure 3:
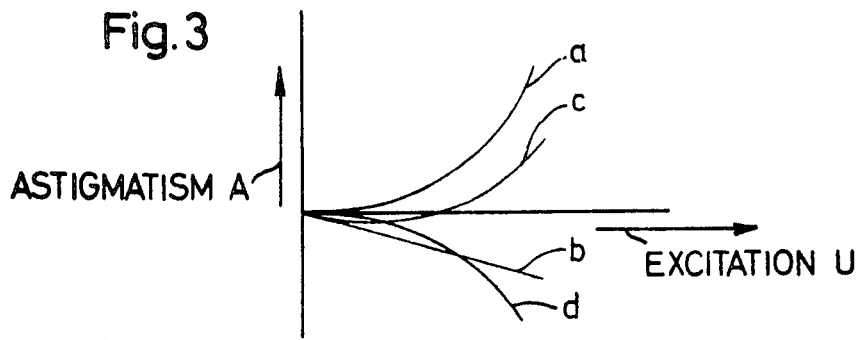
FIG. 3 is a graphical presentation illustrating the compensating action of the stigmator in dependence upon the stigmator excitation.

FIG. 3 is a graphical presentation of the astigmatism A versus the excitation u of the deflection system and the stigmator. In FIG. 3, the abscissa represents the excitation u and the ordinate represents the astigmatism A. Curve "a" depicts the deflection astigmatism that would be present in the absence or disconnection of the stigmator. Since an excitation current is supplied to the stigmator coils 15, 16, 15', 16' or 17, 18, 17', 18' of FIG. 2, and said current is linearly proportional to the excitation of the deflection coils, there results an operation of the stigmator for which is illustrated by curve "b". The astigmatism of the arrangement consisting of the deflection system and stigmator follows the curve designated "c".

On the other hand, a complete compensation of the astigmatism occurs if an excitation of the stigmator is generated which is proportional to the second power of the excitation of the deflection coils, so that the stigmator develops for itself an astigmatism which corresponds to curve "d". In this instance, the corresponding curve of the combined arrangement follows the line A = 0.

Figure 4:
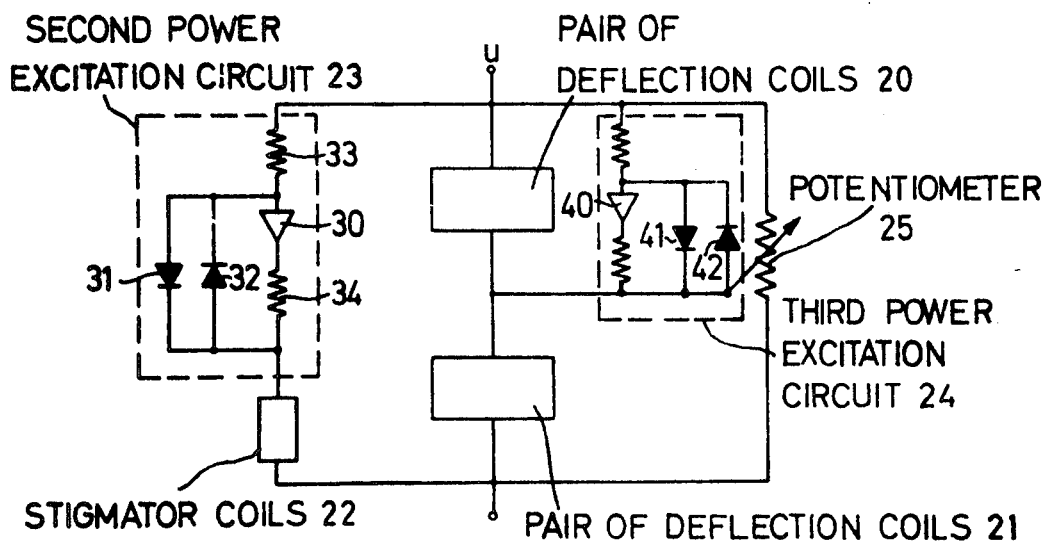
FIG. 4 is a schematic circuit diagram of a circuit for balancing out the distortion.

FIG. 4 schematically illustrates the supply of the stigmator and the deflection coils with which the astigmatism and the distortion are compensated. The two pairs of deflection coils disposed behind one another in beam direction and effecting the deflection in the same plane are designated by reference numerals 20 and 21. The stigmator coils are designated by 22. From the excitation u, a magnitude for supplying the stigmator 22 is formed by means of a suitable circuit 23, the magnitude is proportional to the second power of the excitation u. From the same excitation u, a magnitude is derived in the additional circuit unit 24 which is proportional to the third power of the excitation u and serves to finely adjust the excitation of the deflection coils 20 and 21. With larger deflection angles, a linear adjustment by means of the potentiometer 25 is not satisfactory to always direct the beam to a specific point designated 7 in FIG. 1.

The circuit 23 for generating the voltage proportional to $u^2$ comprises an operation module 30 connected in negative feedback with two antiparallel diodes 31 and 32. The diodes 31, 32 have a characteristic which causes the current flowing in the forward direction to have a quadratic dependence on the voltage. The coefficient of the feedback is determined by resistors 33 and 34.

Correspondingly, the circuit 24 for generating a voltage proportional to $u^3$ comprises an operation module 40 with negative-feedback diodes 41 and 42. Diodes 41, 42 operate in the region of their characteristic that exhibits a cubic dependence of current on the forward voltage.

Figure 5:
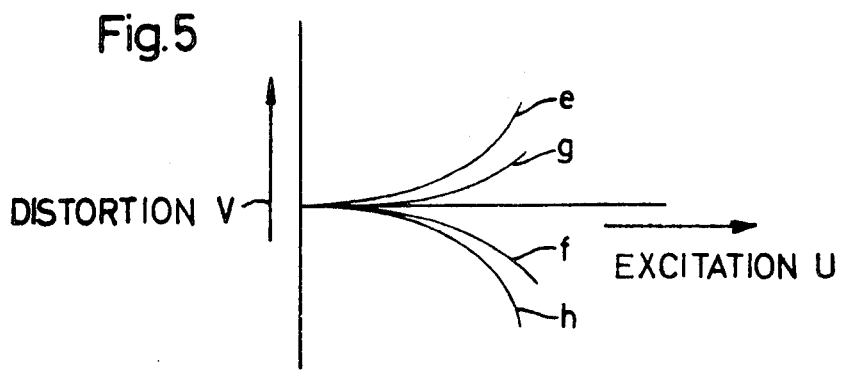
FIG. 5 is a graphical presentation, corresponding to FIG. 3, illustrating the dependence of the distortion correction upon the excitation of the deflection system.

FIG. 5 illustrates the distortion V versus the excitation u of the deflection system. In FIG. 5, the abscissa represents the excitation u and the ordinate represents the distortion V. Without adjustment, there is a deflection distortion in accordance with curve "e". With a quadratic or second power correction, an additional distortion in accordance with curve "f" is developed, so that a residual distortion according to curve "g" remains. Only with an adjustment with a magnitude proportional to the third power of the excitation u, is the compensating distortion generated thereby corresponding to curve "h" so large that the remaining total distortion has a value of 0.

To those skilled in the art it will be obvious upon a study of this disclosure that the invention permits of various modifications and hence may be given embodiments other than illustrated and described herein, without departing from the essential features of the invention and within the scope of the claims annexed hereto.

I claim:

1. In combination in a charged particle beam device having a beam generator, means for directing a beam from the generator along a beam axis and a plurality of deflecting stages, respectively disposed at different locations along the beam axis from the beam generator, a device for eliminating deflection errors disposed at the location of one of said plurality of deflection stages closest to the beam generator, said one deflecting stage comprising a plurality of deflection systems including a first and a second deflection member each having respective sides disposed in mutually parallel planes on opposite sides of the beam axis, and a third and a fourth deflection member each having respective sides also disposed in mutually parallel planes on opposite sides of the beam axis, the planes in which said sides of said first and second deflection members are disposed being perpendicular to the planes in which said sides of said third and fourth deflection members are disposed, said device for eliminating deflection errors comprising a stigmator having at least four pairs of field generating means, each of said four pairs respectively having two mutually adjacent field generating members with at least one side thereof parallel to one another, said one side of each of said two mutually adjacent field generating members being disposed in mutually parallel planes located on the same side of the beam axis, said four pairs of field generating means including a first and a second pair, the one side of the field generating members of said first and second pairs of field generating means being parallel to and spaced from one another on opposite sides of the beam axis, and a third and a fourth pair of field generating means, the one side of the field generating members of said third and fourth pairs being also parallel to and spaced from one another on opposite sides of the beam axis, the planes in which said one side of said field generating members of said first and second pairs of field generating means are disposed being perpendicular to the planes in which said one side of said field generating members of said third and fourth pairs of field generating means are disposed, the planes in which said one side of said field generating members of said first, second, third and fourth pairs of field generating means are disposed extending at an angle of 45° to the planes in which said sides of said first, second, third and fourth deflection members are disposed, and all of said first, second, third and fourth deflection members and said field generating member of said first, second, third and fourth pairs of field generating means having a common sectional plane extending perpendicularly to the beam axis and perpendicularly to said planes in which said sides of said first, second, third and fourth deflection members and said one side of said field generating members of said first, second, third and fourth pairs of field generating means are disposed said device further including circuit means connected to said deflection systems for supplying thereto an excitation current controlled by an excitation voltage, said circuit means including ancillary means for supplying said stigmator with an adjusting current proportional to the square of said excitation voltage, said circuit means including additional means for supplying to one of said deflection systems an adjusting current proportional to the third power of said excitation voltage.

* * * * *